US 9,093,775 B2

(12) United States Patent
Perez-Uria et al.

(10) Patent No.: US 9,093,775 B2
(45) Date of Patent: Jul. 28, 2015

(54) CONNECTION PIN FOR MOUNTING IN A COMPONENT CARRIER, A METHOD FOR PRODUCING AN ELECTRONIC ASSEMBLY COMPRISING A MOTHERBOARD WITH STACKABLE MODULES COMPRISING A COMPONENT CARRIER, AND SUCH AN ELECTRONIC ASSEMBLY

(75) Inventors: Igor Perez-Uria, Järfälla (SE); Ola Arvidsson, Kalmar (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 5 days.

(21) Appl. No.: 14/000,851

(22) PCT Filed: Feb. 25, 2011

(86) PCT No.: PCT/SE2011/050222
§ 371 (c)(1),
(2), (4) Date: Aug. 21, 2013

(87) PCT Pub. No.: WO2012/115555
PCT Pub. Date: Aug. 30, 2012

(65) Prior Publication Data
US 2013/0330966 A1    Dec. 12, 2013

(51) Int. Cl.
*H01R 9/24* (2006.01)
*H01R 13/516* (2006.01)
(Continued)

(52) U.S. Cl.
CPC .............. *H01R 13/516* (2013.01); *H05K 3/368* (2013.01); *H05K 1/141* (2013.01); *H05K 3/3447* (2013.01); *H05K 2201/042* (2013.01); *H05K 2201/10303* (2013.01); *H05K 2201/10871* (2013.01)

(58) Field of Classification Search
CPC ................................. H01R 13/04; H01R 43/16
USPC ............ 29/839, 843, 845, 860, 877; 439/839, 439/843, 845, 860, 877
See application file for complete search history.

(56) References Cited

U.S. PATENT DOCUMENTS 2,814,024 A * 11/1957 Narozny ......................... 439/58
3,123,664 A *  3/1964 Logan .......................... 174/88 R
(Continued)

FOREIGN PATENT DOCUMENTS

DE        44 22 876 A1    1/1995
GB        2 006 550 A     5/1979
(Continued)

OTHER PUBLICATIONS

International Search Report, PCT/SE2011/050222, Jun. 29, 2011.
(Continued)

*Primary Examiner* — Briggitte R Hammond
(74) *Attorney, Agent, or Firm* — Myers Bigel Sibley & Sajovec, P.A.

(57) ABSTRACT

A connection pin for mounting in a through-hole provided in a component carrier of an electronic assembly, the connection pin comprising an anchoring part adapted for insertion into said through-hole, a contact part adapted to extend outside said through-hole, and a flange part adapted to abut against said component carrier and located between said anchoring part and said contact part. The connection pin is provided with an internal cavity, which is provided with an outer opening at a free end of the anchoring part. The contact part is provided with a protruding elongated interconnection member at a free end thereof, and the respective shapes of the interconnection member and the internal cavity are such that the interconnection member is adapted for insertion into a corresponding internal cavity of another similar connection pin. A method for producing an electronic assembly with stackable modules is also disclosed.

10 Claims, 4 Drawing Sheets

(51) Int. Cl.
*H05K 3/36* (2006.01)
*H05K 1/14* (2006.01)
*H05K 3/34* (2006.01)

(56) References Cited

U.S. PATENT DOCUMENTS

| | | | | |
|---|---|---|---|---|
| 3,416,122 | A * | 12/1968 | Kinkaid | 439/72 |
| 3,832,603 | A * | 8/1974 | Cray et al. | 361/790 |
| 4,186,982 | A * | 2/1980 | Cobaugh et al. | 439/82 |
| 4,420,877 | A * | 12/1983 | McKenzie, Jr. | 29/739 |
| 4,660,922 | A * | 4/1987 | Cooney et al. | 439/889 |
| RE32,540 | E * | 11/1987 | Murphy | 206/716 |
| 4,906,198 | A * | 3/1990 | Cosimano et al. | 439/82 |
| 5,046,971 | A * | 9/1991 | Ruggiero et al. | 439/741 |
| 5,456,608 | A | 10/1995 | Rogers et al. | |
| 5,480,309 | A | 1/1996 | Arisaka | |
| 5,915,999 | A * | 6/1999 | Takenaka et al. | 439/751 |
| 6,217,346 | B1 | 4/2001 | Cubon | |
| 6,384,341 | B1 | 5/2002 | Rothermel et al. | |
| 6,545,890 | B2 | 4/2003 | Pitzele | |
| 6,818,839 | B2 * | 11/2004 | Hosaka et al. | 174/262 |
| 7,025,604 | B2 | 4/2006 | Fronk | |
| 7,377,823 | B2 | 5/2008 | Chen | |
| 8,324,642 | B2 | 12/2012 | Grajcar | |
| 2004/0137803 | A1 * | 7/2004 | Pitzele | 439/884 |
| 2007/0093143 | A1 | 4/2007 | Nomura | |
| 2008/0207015 | A1 * | 8/2008 | Sueyoshi | 439/75 |
| 2008/0265398 | A1 | 10/2008 | Matsumoto et al. | |
| 2009/0298312 | A1 | 12/2009 | Gueckel | |
| 2011/0207363 | A1 * | 8/2011 | Shimizu | 439/374 |
| 2012/0088381 | A1 * | 4/2012 | Wild et al. | 439/131 |
| 2013/0330966 | A1 * | 12/2013 | Perez-Uria et al. | 439/569 |

FOREIGN PATENT DOCUMENTS

| | | |
|---|---|---|
| JP | 6-84550 | 3/1994 |
| JP | 06084550 A * | 3/1994 |
| WO | WO 2007/008264 A1 | 1/2007 |

OTHER PUBLICATIONS

Written Opinion of the International Searching Authority, PCT/SE2011/050222, Jun. 29, 2011.
International Preliminary Report on Patentability, PCT/SE2011/050222, Jul. 2, 2013.
International Search Report, PCT/SE2011/050223, Sep. 7, 2011.
Written Opinion of the International Searching Authority, PCT/SE2011/050223, Sep. 7, 2011.
International Search Report, PCT PCT/SE2011/050221, Jun. 29, 2011.
Written Opinion of the International Searching Authority, PCT/SE2011/050221, Jun. 29, 2011.
"L'insertion a force dans les circuits imprimes" Toute L'electronique, Societe Des Editions Radio. Paris, FR, No. 551, Feb. 1, 1990; XP000095549, pp. 34-37. No Translation Available.
Communication pursuant to Article 94(3) EPC, European Application No. 11 715 082.1, Mar. 24, 2005.

* cited by examiner

CONNECTION PIN FOR MOUNTING IN A COMPONENT CARRIER, A METHOD FOR PRODUCING AN ELECTRONIC ASSEMBLY COMPRISING A MOTHERBOARD WITH STACKABLE MODULES COMPRISING A COMPONENT CARRIER, AND SUCH AN ELECTRONIC ASSEMBLY

CROSS REFERENCE TO RELATED APPLICATION

This application is a 35 U.S.C. §371 national stage application of PCT International Application No. PCT/SE2011/050222, filed on 25 Feb. 2011, the disclosure and content of which is incorporated by reference herein in its entirety. The above-referenced PCT International Application was published in the English language as International Publication No. WO 2012/115555 A1 on 30 Aug. 2012.

TECHNICAL FIELD OF THE INVENTION

The present invention relates to a connection pin for mounting in a through-hole provided in a component carrier, a method for producing an electronic assembly comprising a motherboard with at least one stackable module, and an electronic assembly comprising a motherboard with at least one stackable module.

BACKGROUND OF THE INVENTION

In the electronics industry, the demands for higher density electronics, higher power density and general optimisation of the overall onboard package are increasing. One alternative to fulfil these demands and solve the related problems is to use stack mounting technology, e.g. by stacking onboard power modules, memory modules, etc. on a motherboard or any type of basic module or component carrier, being part of an electronic assembly. In this context there is a need for low resistance and high thermal conductivity connections between the stack design and the motherboard. The available solutions involve use of pin/socket combinations, e.g. a metallic socket inserted in a hole provided therefor in the upper part of a connection pin and into which the lower part of another connection pin is inserted, or a homogenous interconnection pin across the entire stacked design. However, these solutions are either of high resistance disturbing the thermal and electrical performance and/or they are poorly adapted for automated assembly processes.

In the electronics industry, connection pins are widely used to provide connection between different parts of an electronic assembly. The connection pins are e.g. mounted in a through-hole in a component carrier or they are surface mounted to a component carrier, which component carrier can have different applications and/or combinations thereof, such as: the component carrier can be a substrate that can be part of a printed circuit board, it can carry electronic components and form a component board, it can carry modules such as power modules or stackable modules comprising different components, it can be part of a motherboard etc., all of which can form, or be parts or modules of an electronic assembly. The connection pins usually provide both mechanical connection between the parts of the assembly, as well as electrical connection. There exists a number of known assembly techniques for anchoring a connection pin in or to a component carrier, such as wave soldering, surface mounted pin in solder paste, press-fit, rivet/clinching, etc. The chosen technique mostly depends on the application in which the component carrier is used and the requirements involved.

SUMMARY OF THE INVENTION

The object of the present invention is to improve stack mounting technology.

This object is achieved by means of a connection pin for mounting in a through-hole provided in a component carrier, the connection pin comprising an anchoring part adapted for insertion into said through-hole, a contact part adapted to extend outside said through-hole, and a flange part adapted to abut against said component carrier and located between said anchoring part and said contact part. The connection pin is characterized in that it is provided with an internal cavity, that the internal cavity is provided with an outer opening at a free end of the anchoring part, that the contact part is provided with a protruding elongated interconnection member at a free end thereof, and that the respective shapes of the interconnection member and the internal cavity are such that the interconnection member is adapted for insertion into a corresponding internal cavity of another similar connection pin.

By designing a connection pin to constitute the effective interconnection between a motherboard and a module stacked on the motherboard of an electronic assembly, or between modules in several levels, according to the present invention, it becomes possible to obtain a proper solder joint between the motherboard/module or modules mounted one on top of the other by dispensing solder in the internal cavity of the lower connection pin, or alternatively in a corresponding cavity provided in the motherboard, and then inserting the interconnection member of the connection pin, already mounted in the module on top, into said cavity and performing the soldering operation. This solder joint offers the advantage of optimal low resistance connection and enhanced thermal integrity. Moreover, the connection pin according to the invention is also suitable for repeatable and even automated assembly processes, since for every module all of the connection pins may be mounted in the component carrier, preferably in a simultaneous step, before the module is mounted on the underlying module or motherboard by means of inserting the interconnection members into corresponding cavities all at the same time. An intermediate step of dispensing solder paste into the cavities is also suitable for automation. Through this, the individual soldering of every connection pin to the component carrier, as in prior art, is no longer necessary. The solder connection also provides good mechanical connection. Another advantage is that additional separate connection devices are made redundant.

In accordance with the above is therefore also defined, in accordance with the present invention, a method for producing an electronic assembly comprising a motherboard with at least one stackable module, comprising:

Step 1: providing at least one stackable module by mounting connection pins as defined in any one of the claims related to a connection pin, in respective through-holes provided in a component carrier by, for each connection pin, inserting the anchoring part into a through-hole, and anchoring the connection pin in the through-hole, Step 2: mounting a first stackable module on a motherboard, by inserting the interconnection member of a respective connection pin into a mounting hole provided therefor in the motherboard, pre-empted by dispensing soldering paste in said cavity of the motherboard, Step 3: dispensing soldering paste between the connection pins and the component carrier, Step 4: performing a melting operation on the soldering paste, whereby the soldering paste between the respective connection pin and the motherboard melts and provides electric connection between the connection pin and the motherboard, whereby the soldering paste between the connection pins and the component carrier melts and provides electric connection between the connection pin and the component carrier, resulting in electric connection between the module and the motherboard. According to a further feature, the connection pin may have a flange part that has a contact side adapted for abutment against the component carrier, wherein the internal cavity has at least one inner opening, adjacent to the flange part, wherein said contact side is provided with at least one groove communicating with said inner opening, and wherein the at least one groove stretches from the inner opening to a corresponding groove opening in an external axial surface of the flange part. By means of these features, the advantage is achieved the solder paste may be dispensed into the internal cavity from the outer opening and the solder may then flow from the internal cavity out through the inner opening and into said groove, thus making it possible to solder the connection pin to the component carrier, including soldering to the bottom surface of the component carrier abutting the flange part, by only dispensing solder paste from the upper side of the component carrier into said internal cavity. The solder may even flow to the outside of the flange part, via the groove/grooves and their openings in the axial surface of the flange. The grooves may also serve as degassing channels when the solder is melting.

According to a variant, the contact side is provided with two grooves, wherein a first groove stretches across the contact side from a first groove opening to a second groove opening and via a first inner opening, and a second groove stretches across the contact side from a third groove opening to a fourth groove opening via a second inner opening.

According to another variant, the contact side is provided with three grooves and the internal cavity is provided with three inner openings, wherein a first groove stretches across the contact side from a first groove opening to a second groove opening and via a first inner opening, a second groove stretches across the contact side from a third groove opening to a fourth groove opening via a second inner opening, and a third groove stretches across the contact side from a fifth groove opening to a sixth groove opening via a third inner opening.

Naturally, the number of grooves can vary and more than three grooves are conceivable within the scope of the inventive idea, as well as the shape of the grooves may vary and their exact location may vary. For example, it may be possible to have grooves that do not extend all the way out to external axial surface of the flange part.

The number and locations of the inner openings may also vary.

According to another feature, the anchoring part of the connection pin may comprise a wall surrounding the internal cavity, which wall has at least two wall portions forming deformation zones and which wall portions are adapted to be located in the through-hole when the anchoring part is inserted in the through-hole, such that, upon exertion of a force on a free end of the anchoring part of the pin when the anchoring part is inserted in the through-hole, the deformation zones are deformed within the through-hole and thereby achieving a press fit of the connection pin in the through-hole. The connection pin accordingly offers the advantage that it can be mounted and anchored in a component carrier with less deformation of the component carrier than in prior art techniques. The force exerted by an anchoring tool, similar to riveting, in order to anchor the pin in the component carrier is only exerted on the end of the anchoring part of the pin, no force is exerted on the component carrier from the tool. Furthermore, the force exerted from the deformation of the anchoring part of the pin in the through-hole, is only exerted in a transverse direction, which means that the risk of having a curving of the component carrier as a result is reduced.

The deformation zones may be formed by providing at least two wall portions having a wall thickness that is less than the thickness of an adjacent wall portion.

Alternatively, deformation zones may be formed having the wall surrounding the internal cavity of the anchoring part provided with at least two wall openings having a weakening effect on the wall, and thereby the wall displays wall portions forming deformation zones between the openings, and wherein at least one inner opening of the internal cavity, adjacent to the flange part, communicates with one of the at least two openings in the wall surrounding the internal cavity.

The method according to the present invention may further be defined by comprising, between step 3 and step 4: mounting an additional stackable module, provided in accordance with step 1, on top of the first module, by dispensing soldering paste in the internal cavities of the connection pins of the first module, via the outer opening, and inserting the interconnection members of the connection pins of the additional module into the corresponding internal cavities of the connection pins of the first module via the respective outer openings of the internal cavities.

Further, the method may comprise mounting an optional number of additional stackable modules on a motherboard, provided in accordance with step 1, by dispensing soldering paste and inserting the interconnection members of the connection pins of the additional module into the corresponding internal cavities of the connection pins of a previously mounted stackable module via the respective outer openings of the internal cavities of said previously mounted stackable module, and repeating this for as many times as required before performing a melting operation of the solder.

Further, the method may comprise, between step 1 and step 2, printing of a PCB pattern on the module, and/or mounting of any surface mounted components on the module.

According to an additional feature of the method, all of the connection pins of one module are mounted simultaneously in the through-holes provided in the component carrier.

In another aspect of the invention is defined an electronic assembly comprising a motherboard with at least one stackable module, produced in accordance with any one of the method claims.

In order to clarify the meaning of certain terms used in this description, the following definitions are offered:

Component carrier in the present context shall be interpreted to include, but without any limiting effect, a substrate comprising one or more layers and forming a component carrier, or any other carrier, suitable for mounting electronic components thereon, for printing or otherwise producing circuit patterns on the surface thereof, thereby obtaining a printed circuit board, a motherboard, a component board, or similar, or the substrate/carrier may used for different applications e.g. carry a power module, memory module, a broadband module, etc.

Module in the present context shall be interpreted to include, without being limited thereto, as component carrier as defined above and in accordance with the present invention, or any other printed circuit board, motherboard, component board, or similar, and also including power modules, memory modules, broadband modules, etc.

Electronic assembly in the present context shall be interpreted to include, but without being limited thereto, an assembly comprising two or more modules as defined above, and one module being mounted on top of the other module.

BRIEF DESCRIPTION OF THE DRAWINGS

A detailed description of the present invention and embodiments thereof, given as examples only, will now be made with reference to the accompanying drawings, in which.

DETAILED DESCRIPTION OF THE INVENTION

In the following detailed description, the same reference numbers will be used for the same or corresponding parts in the different figures.

Figure 1:
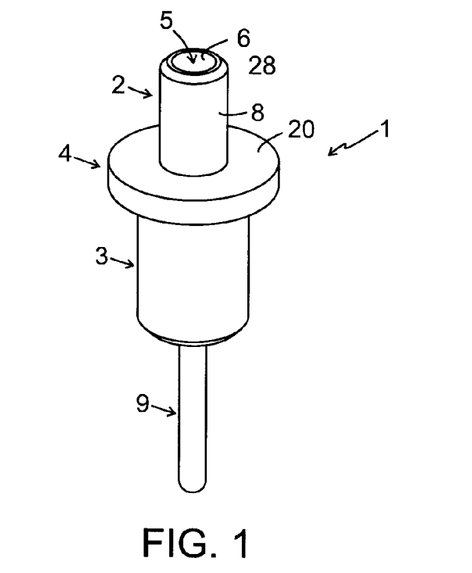
FIG. 1 illustrates schematically a connection pin according to the present invention.
Figure 2:
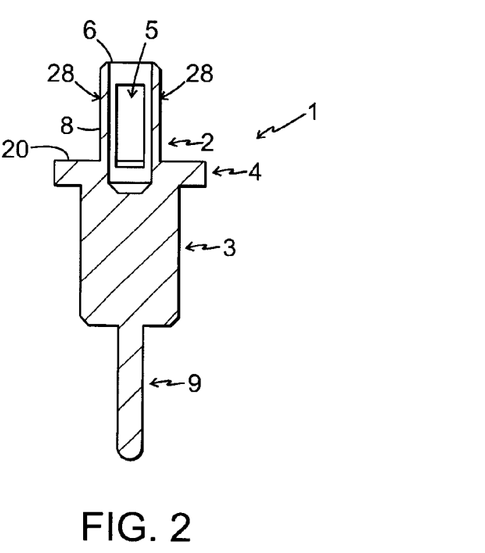
FIG. 2 illustrates the connection pin of FIG. 1, in cross section and in a side view.

In FIGS. 1 and 2 are illustrated a connection pin according to the invention. The connection pin 1 has an anchoring part 2, adapted for insertion into a through-hole in a component carrier, see FIGS. 8-10, a contact part 3, and a flange part 4 located between the anchoring part and the contact part. In the anchoring part 2 there is provided an internal cavity 5. The cavity has an outer opening 6 at the free end of the anchoring part 2. The connection pin 1 further comprises an elongated interconnection member 9 protruding from the free end of the contact part 3. The shape of the interconnection member 9 is adapted to be insertable into the internal cavity 5 of another similar connection pin, and vice versa, as illustrated in FIG. 10.

Figure 3:
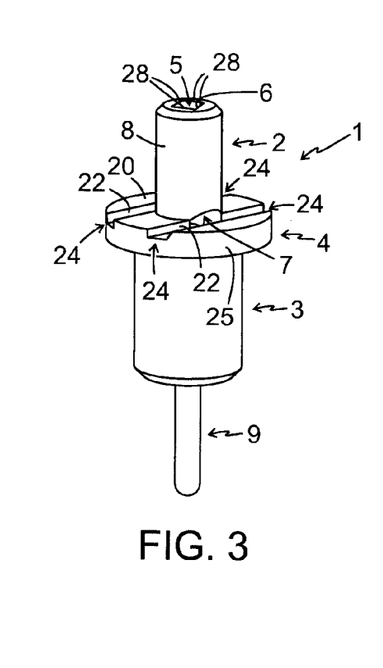
FIG. 3 illustrates schematically a variant of a connection pin according to the present invention.
Figure 4:
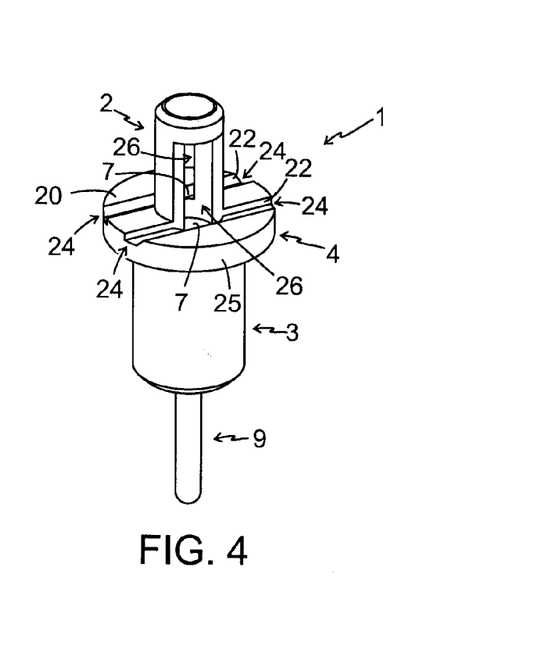
FIG. 4 illustrates schematically another variant of a connection pin according to the present invention.
Figure 5:
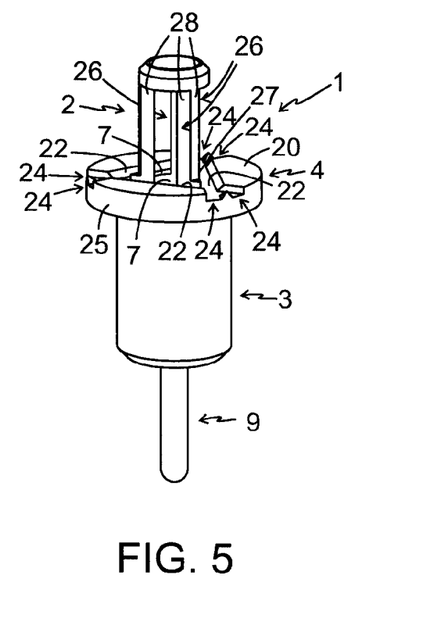
FIG. 5 illustrates schematically yet another variant of a connection pin according to the present invention.

In FIGS. 3-5, variants of the connection pin are shown, in which the internal cavity 5 is also provided with an inner opening 7 at the opposite end of the anchoring part 2 compared to the outer opening 6, and adjacent to the flange part 4.

Figure 8:
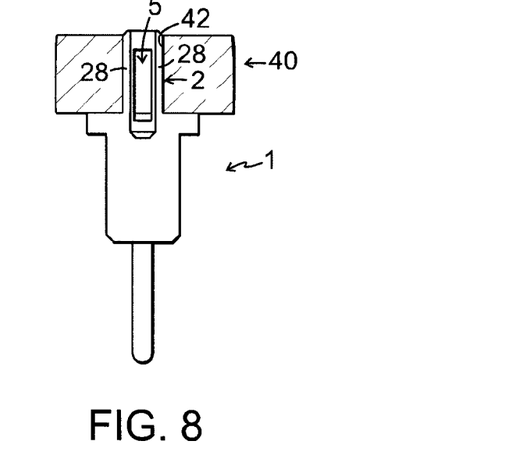
FIG. 8 illustrates a connection pin according to the invention, mounted in a component carrier.
Figure 9:
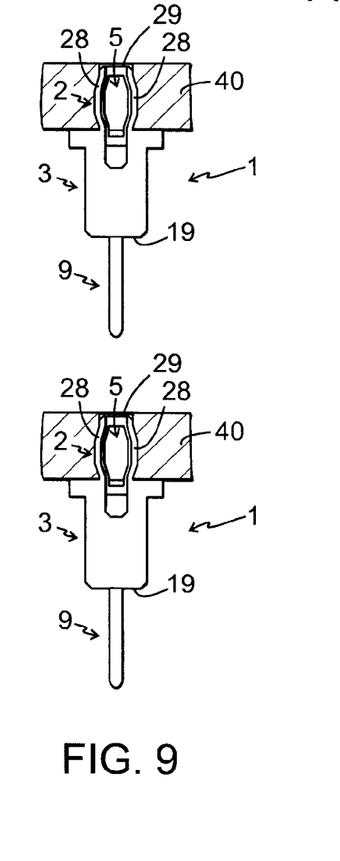
FIGS. 9-10 illustrate steps of the method according to the present invention, and the electronic assembly.
Figure 10:
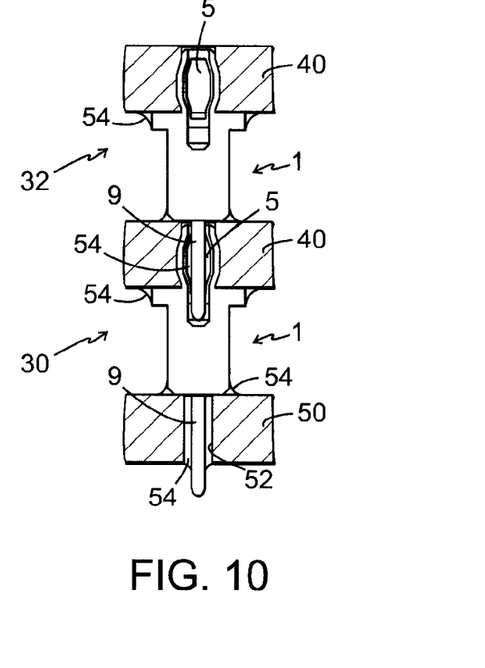
Figure 11:
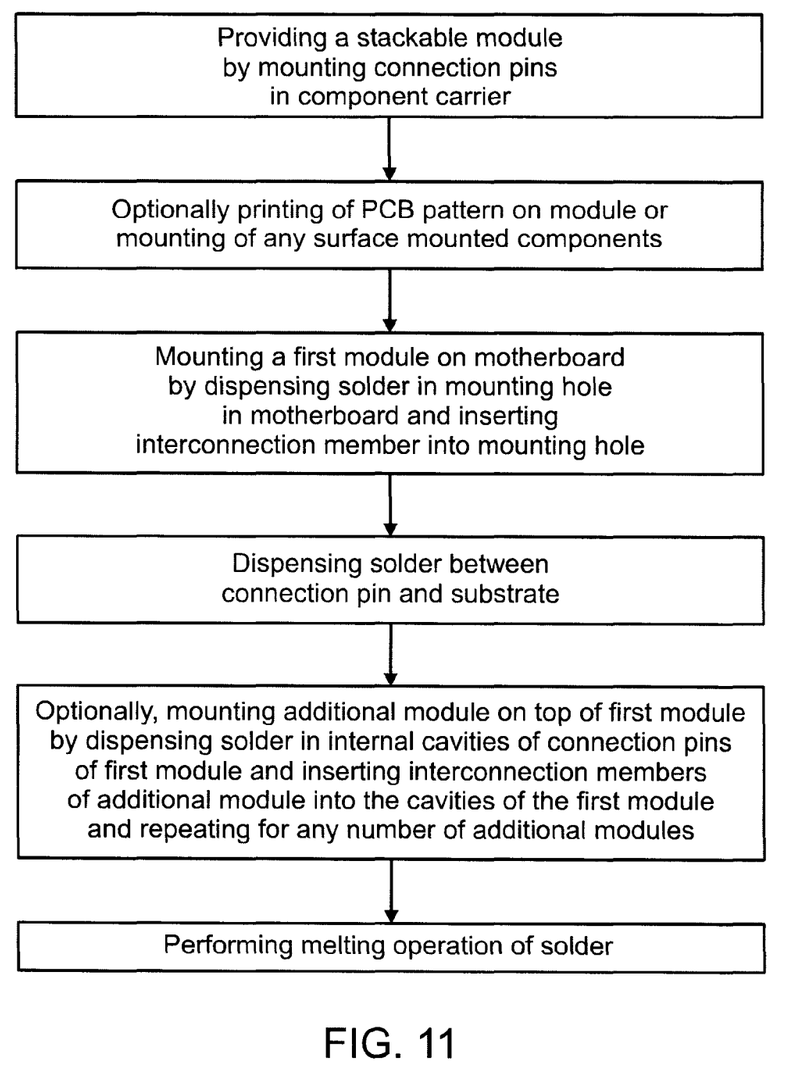
FIG. 11 shows a flow chart illustrating the method according to the present invention.

To continue, the flange part 4 has a contact side 20 side adapted for abutment against the component carrier 40, see also FIGS. 8-10. Said contact side is provided with at least one groove 22 communicating with said at least one inner opening 7, wherein each groove 22 of said at least one groove stretches from one of said at least one inner opening 7 to a corresponding groove opening 24 in an external axial surface 25 of the flange part 4.

As illustrated in FIGS. 3-5, the number of grooves is two or three. However, the number of grooves may vary, even above three, as may also their shape and exact location. The number of inner openings should preferably correspond to the number of grooves.

The anchoring part 2 of the connection pin 1 has a wall 8 surrounding the internal cavity 5. The wall has at least two wall portions 28 forming deformation zones. In a first variant illustrated in FIG. 6, the deformations zones are obtained by having wall portions 28 that have a thickness in cross section that is less than the thickness of adjacent wall portions. This may for example be achieved by having different geometrical shape, in cross section, of the internal cavity and the external shape of the anchoring part. In the example illustrated in FIG. 3 and FIG. 6, the external shape of the connection pin is cylindrical. In a radial cross section, the internal shape is a quadrant while the external shape is circular, thus resulting in four wall portions 28 having a thickness that is less than the thickness of the adjacent wall portions. Thereby, deformation zones are obtained by the thinner wall portions. Many other combinations of geometrical shapes are conceivable resulting in wall portions having different wall thicknesses and thus creating deformation zones.

Figure 7:
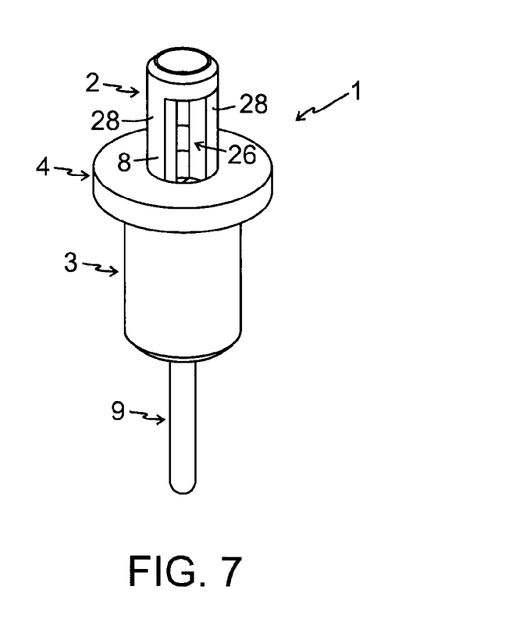
FIG. 7 illustrates schematically yet a further variant of a connection pin according to the present invention.

According to a variant, as illustrated in FIGS. 4, 5 and 7, the deformation zones are achieved by providing at least two wall openings 26 in the wall 8 of the internal cavity 5, thereby weakening the wall portions between the openings and consequently resulting in two wall portions 28 forming the deformation zones. Naturally, the number of openings and the exact location of the openings may vary, as well as the shape of the openings. In FIG. 5 is shown a variant having three wall openings 26, and consequently three wall portions 28 forming deformation zones.

As illustrated in FIGS. 4, 5 and 7, the inner opening 7 may communicate with the wall opening 26, or in other words, the wall opening 26 also functions as the inner opening 7 communicating with the grooves 22. However, it would also be conceivable according to the second variant to have a wall opening 26 separated from the inner opening 7.

Figure 6:
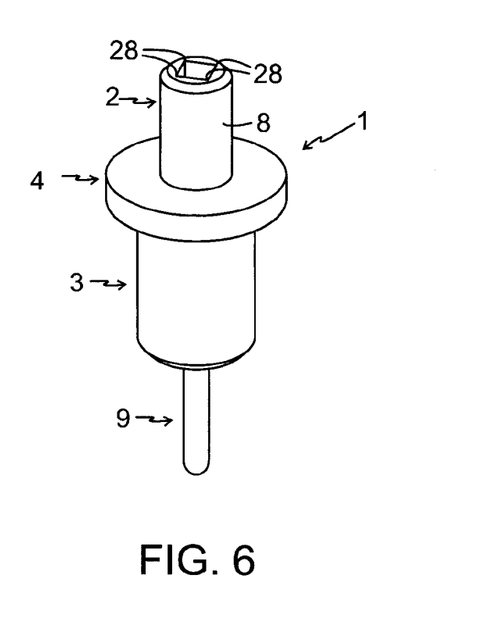
FIG. 6 illustrates schematically a further variant of a connection pin according to the present invention.

In FIG. 6 is illustrated a connection pin 1 corresponding to the one illustrated in FIG. 1, but having deformation zones 28 made in accordance with FIG. 3

In FIG. 8, is schematically illustrated a connection pin 1, which could be any one of the variants of a connection pin as previously described. The connection pin 1 has been inserted in a through-hole 42 of the component carrier 40 by means of the anchoring part 2 of the pin 1.

In FIG. 9 is illustrated two connection pins 1 after having been anchored in the component carrier 40 by exerting a force on a free end 29 of the anchoring part 2 of the pin, preferably while holding the end surface 19 of the contact part 3 against a suitable hard surface, functioning as an anvil or die and able to withstand the exerted force without deformation. Naturally, that surface should be provided with a suitable opening for the interconnection member. When the force is exerted on the free end 29, the deformation zones 28 of the walls of the internal cavity 5 of the connection pin are deformed to a press fit inside the through-hole 42.

The respective component carrier 40 with the mounted connection pins 1, as illustrated in FIG. 9, now form a module that is ready to be mounted either on top of a motherboard 50, or one module on top of the other, as shown in FIG. 10.

Accordingly, in FIG. 10 is shown a first module 30 and a second module 32, both comprising a component carrier 40 with a connection pin 1 mounted in accordance with the present invention. The component carrier itself may be provided with printed circuit board patterns, it may have electronic components mounted thereon, etc., and it may used for different applications e.g. carry a power module, memory module, a broadband module, etc. as previously described, but not shown in the figure.

In the figure is also shown a motherboard 50 provided with a mounting hole 52 adapted to receive an interconnection member 9 of a connection pin 1 being part of a module as described above. During assembly, solder is dispensed into the mounting hole 52 of the motherboard 50 and the first module 30 is then mounted on the motherboard by inserting the interconnection member 9 into the mounting hole 52. In a next step, solder is dispensed into the internal cavity 5 of the connection pin 1 belonging to the first module 30, and a second module 32 is then mounted on top of the first module 30 by inserting its interconnection member 9 into the internal cavity of the connection pin of the first module. These steps may then be repeated as many times as wanted, depending on how many modules that are to be mounted, before the actual soldering operation is performed whereby the solder is melted and both mechanical and electrical connection is obtained wherever there is solder. The solder seams are numbered 54 in FIG. 10. When the connection pins are provided with grooves for the solder, as in FIGS. 3, 4 and 5, it will be sufficient to dispense solder via the internal cavity 5, and avoid having to apply solder from underneath the component carrier, which makes it possible to have an automated process.

The motherboard 50 and the modules 30, 32, forming an electronic assembly, are now both physically and electrically connected, via the soldering of the connection pins.

This method is also illustrated in the flow chart of FIG. 10, showing the different steps of the method:

Step 1: providing at least one stackable module by mounting connection pins, in respective through-holes provided in a component carrier by, for each connection pin, inserting the anchoring part into a through-hole, and anchoring the connection pin in the through-hole, Step 2: mounting a first module on a motherboard, by inserting the interconnection member of a respective connection pin into a mounting hole provided therefor in the motherboard, pre-empted by dispensing soldering paste in said cavity of the motherboard, Step 3: dispensing soldering paste between the connection pins and the component carrier, Step 4: performing a melting operation on the soldering paste, whereby the soldering paste between the respective connection pin and the motherboard melts and provides electric connection between the connection pin and the motherboard, whereby the soldering paste between the connection pins and the component carrier melts and provides electric connection between the connection pin and the component carrier, resulting in electric connection between the module and the motherboard.

The method may further comprise mounting an additional stackable module, provided in accordance with step 1, on top of the first module, by dispensing soldering paste in the internal cavities of the connection pins of the first module, via the outer opening, and inserting the interconnection members of the connection pins of the additional module into the corresponding internal cavities of the connection pins of the first module via the respective outer openings of the internal cavities.

The method may further comprise mounting an optional number of additional stackable modules on a motherboard, provided in accordance with step 1, by dispensing soldering paste and inserting the interconnection members of the connection pins of the additional module into the corresponding internal cavities of the connection pins of a previously mounted stackable module via the respective outer openings of the internal cavities of said previously mounted stackable module, and repeating this for as many times as required before performing a melting operation of the solder.

In addition the method may comprise, between step 1 and step 2, printing of a PCB pattern on the module, and/or mounting of any surface mounted components on the module.

The present invention shall not be limited to the illustrated examples and embodiments, but may be modified in many ways within the scope of the appended patent claims, as will be recognized by the person skilled in the art.

The invention claimed is:

1. A connection pin for mounting in a through-hole provided in a component carrier of an electronic assembly, the connection pin comprising:
    an anchoring part adapted for insertion into said through-hole;
    a contact part adapted to extend outside said through-hole and provided with a protruding elongated interconnection member at a free end thereof; and
    a flange part adapted to abut against said component carrier and located between said anchoring part and said contact part, and having an internal cavity with an outer opening at a free end of the anchoring part, that the respective shapes of the interconnection member and the internal cavity are such that the interconnection member is adapted for insertion into a corresponding internal cavity of another similar connection pin, and further that the flange part has a contact side adapted for abutment against the component carrier, that the internal cavity has at least one inner opening, adjacent to the flange part, that said contact side is provided with at least one groove communicating with said inner opening, and that the at least one groove stretches from the inner opening to a corresponding groove opening in an external axial surface of the flange part, whereby solder dispensed through the outer opening and into the internal cavity can flow from the internal cavity through the at least one inner opening and into said at least one groove,
    wherein the contact side is provided with two grooves, wherein a first groove stretches across the contact side from a first groove opening to a second groove opening and via a first inner opening, and a second groove stretches across the contact side from a third groove opening to a fourth groove opening via a second inner opening.

2. A connection pin for mounting in a through-hole provided in a component carrier of an electronic assembly, the connection pin comprising: an anchoring part adapted for insertion into said through-hole;
    a contact part adapted to extend outside said through-hole and provided with a protruding elongated interconnection member at a free end thereof; and
    a flange part adapted to abut against said component carrier and located between said anchoring part and said contact part, and having an internal cavity with an outer opening at a free end of the anchoring part, that the respective shapes of the interconnection member and the internal cavity are such that the interconnection member is adapted for insertion into a corresponding internal cavity of another similar connection pin, and further that the flange part has a contact side adapted for abutment against the component carrier, that the internal cavity has at least one inner opening, adjacent to the flange part, that said contact side is provided with at least one groove communicating with said inner opening, and that the at least one groove stretches from the inner opening to a corresponding groove opening in an external axial surface of the flange part, whereby solder dispensed through the outer opening and into the internal cavity can flow from the internal cavity through the at least one inner opening and into said at least one groove, wherein the contact side is provided with three grooves and the internal cavity is provided with three inner openings, wherein a first groove stretches across the contact side from a first groove opening to a second groove opening and via a first inner opening, a second groove stretches across the contact side from a third groove opening to a fourth groove opening via a second inner opening, and a third groove stretches across the contact side from a fifth groove opening to a sixth groove opening via a third inner opening.

3. A connection pin for mounting in a through-hole provided in a component carrier of an electronic assembly, the connection pin comprising:

an anchoring part adapted for insertion into said through-hole;

a contact part adapted to extend outside said through-hole and provided with a protruding elongated interconnection member at a free end thereof;and a flange part adapted to abut against said component carrier and located between said anchorin part and said contact part and having an internal cavit with an outer opening at a free end of the anchoring part, that the respective shapes of the interconnection member and the internal cavity are such that the interconnection member is adapted for insertion into a corresponding internal cavity of another similar connection pin, and further that the flange part has a contact side adapted for abutment against the component carrier, that the internal cavity has at least one inner opening, adjacent to the flange part, that said contact side is provided with at least one groove communicating with said inner opening, and that the at least one groove stretches from the inner opening to a corresponding groove opening in an external axial surface of the flange part, whereby solder dispensed through the outer opening and into the internal cavity can flow from the internal cavity through the at least one inner opening and into said at least one groove, wherein the anchoring part comprises a wall surrounding the internal cavity, which wall has at least two wall portions forming deformation zones and which wall portions are adapted to be located in the through-hole when the anchoring part is inserted in the through-hole, such that, upon exertion of a force on a free end of the anchoring part of the pin when the anchoring part is inserted in the through-hole, the deformation zones are deformed within the through-hole and causing a press fit of the connection pin in the through-hole, and wherein the deformation zones are formed by providing at least one wall portion having a wall thickness that is less than the thickness of an adjacent wall portion.

4. A connection pin for mounting in a through-hole provided in a component carrier of an electronic assembly, the connection pin comprising:

an anchoring part adapted for insertion into said through-hole;

a contact part adapted to extend outside said through-hole and provided with a protruding elongated interconnection member at a free end thereof; and a flange part adapted to abut against said component carrier and located between said anchoring part and said contact part, and having an internal cavity with an outer opening at a free end of the anchorin part, that the respective shapes of the interconnection member and the internal cavity are such that the interconnection member is adapted for insertion into a corresponding internal cavity of another similar connection pin, and further that the flange part has a contact side adapted for abutment against the component carrier, that the internal cavity has at least one inner opening, adjacent to the flange part, that said contact side is provided with at least one groove communicating with said inner opening, and that the at least one groove stretches from the inner opening to a corresponding groove opening in an external axial surface of the flange part, whereby solder dispensed through the outer opening and into the internal cavity can flow from the internal cavity through the at least one inner opening and into said at least one groove, wherein the anchoring part comprises a wall surrounding the internal cavity, which wall has at least two wall portions forming deformation zones and which wall portions are adapted to be located in the through-hole when the anchoring part is inserted in the through-hole, such that, upon exertion of a force on a free end of the anchoring part of the pin when the anchoring part is inserted in the through-hole, the deformation zones are deformed within the through-hole and causing a press fit of the connection pin in the through-hole, and wherein the wall surrounding the internal cavity of the anchoring part is provided with at least two wall openings having a weakening effect on the wall, and thereby the wall displays wall portions forming deformation zones between the openings, and wherein at least one inner opening of the internal cavity, adjacent to the flange part, communicates with one of the at least two openings in the wall surrounding the internal cavity.

5. A method for producing an electronic assembly comprising a motherboard with at least one stackable module, comprising Step 1: providing at least one stackable module by mounting connection pins, each of the connection pins comprising:

an anchoring part adapted for insertion into said through-hole;

a contact part adapted to extend outside said through-hole and provided with a protruding elongated interconnection member at a free end thereof; and a flange part adapted to abut against said component carrier and located between said anchoring part and said contact part, and having an internal cavity with an outer opening at a free end of the anchoring part, that the respective shapes of the interconnection member and the internal cavity are such that the interconnection member is adapted for insertion into a corresponding internal cavity of another similar connection pin, and further that the flange part has a contact side adapted for abutment against the component carrier, that the internal cavity has at least one inner opening, adjacent to the flange part, that said contact side is provided with at least one groove communicating with said inner opening, and that the at least one groove stretches from the inner opening to a corresponding groove opening in an external axial surface of the flange part, whereby solder dispensed through the outer opening and into the internal cavity can flow from the internal cavity through the at least one inner opening and into said at least one groove;

the connection pins being provided in respective through-holes provided in a component carrier by, for each connection pin, inserting the anchoring part into a through-hole, and anchoring the connection pin in the through-hole;

Step 2: mounting a first stackable module on a motherboard, by inserting the interconnection member of a respective connection pin into a mounting hole provided therefor in the motherboard, pre-empted by dispensing soldering paste in said mounting hole of the motherboard;

Step 3: dispensing soldering paste between the connection pins and the component carrier, through the respective outer openings of the internal cavities and via the respective internal cavities of the connection pins and said at least one groove in the respective flange part; and Step 4: performing a melting operation on the soldering paste, whereby the soldering paste between the respective connection pin and the motherboard melts and provides electric connection between the connection pin and the motherboard, whereby the soldering paste between the connection pins and the component carrier melts and provides electric connection between the connection pin and the component carrier, resulting in electric connection between the module and the motherboard.

6. The method according to claim 5, comprising, between step 3 and step 4:

mounting an additional stackable module, provided in accordance with step 1, on top of the first module, by dispensing soldering paste in the internal cavities of the connection pins of the first module, via the outer opening, and inserting the interconnection members of the connection pins of the additional module into the corresponding internal cavities of the connection pins of the first module via the respective outer openings of the internal cavities.

7. The method according to claim 6, comprising mounting a number of additional stackable modules on a motherboard, provided in accordance with step 1, by dispensing soldering paste and inserting the interconnection members of the connection pins of the additional module into the corresponding internal cavities of the connection pins of a previously mounted stackable module, and respective outer openings of the internal cavities of said previously mounted stackable module, and repeating this for as many times as the number of additional stackable modules before performing a melting operation of the solder.

8. The method according to claim 5, comprising, between step 1 and step 2, printing of a PCB pattern on the module, and/or mounting of any surface mounted components on the module.

9. The method according to claim 5, wherein all of the connection pins of one module are mounted simultaneously in the through-holes provided in the component carrier.

10. An electronic assembly comprising a motherboard with at least one stackable module, produced in accordance with claim 5.

\* \* \* \* \*